United States Patent [19]
Bowers

[11] Patent Number: 5,075,633
[45] Date of Patent: Dec. 24, 1991

[54] INSTRUMENTATION AMPLIFIER WITH SINGLE SUPPLY CAPACITY AND SIMPLIFIED GAIN EQUATION

[75] Inventor: Derek F. Bowers, Sunnyvale, Calif.

[73] Assignee: Analog Devices, Inc., Norwood, Mass.

[21] Appl. No.: 657,747

[22] Filed: Feb. 19, 1991

[51] Int. Cl.$^5$ ............................................... H03F 3/45
[52] U.S. Cl. ........................................ 330/69; 330/84; 330/144; 330/147; 330/260; 330/284; 330/301
[58] Field of Search .................. 330/84, 69, 147, 144, 330/145, 260, 275, 284, 301

[56] References Cited
U.S. PATENT DOCUMENTS 5,027,081  6/1991  Baum ..................................... 330/84

Primary Examiner—James B. Mullins
Attorney, Agent, or Firm—Koppel & Jacobs

[57] ABSTRACT

A new instrumentation amplifier design uses three operational amplifiers (op amps), each of which has a feedback circuit connected from its output to its inverting input. The first op amp has a unity gain feedback, and is connected through a gain setting resistor to the inverting input of the second op amp. The output of the third op amp is connected through a resistor to the inverting input for the second op amp, while the third op amp's non-inverting input is connected to one of the second op amp's inputs. Differential voltage input signals are applied to the non-inverting inputs of the first and second op amps, while a reference voltage is applied to the inverting input of the third op amp. The circuit is capable of operating with a single voltage supply (V+) by setting the negative voltage supply together with the reference voltage at ground potential. It has a simplified gain equation based upon the ratio between the feedback resistor for the second op amp and the gain setting resistor. Multiple selectable gain setting resistors may be provided to allow for gain programmability, with a special switching circuit that isolates the switch resistance from the gain equation.

13 Claims, 2 Drawing Sheets

INSTRUMENTATION AMPLIFIER WITH SINGLE SUPPLY CAPACITY AND SIMPLIFIED GAIN EQUATION

RELATED APPLICATION

This application is related to U.S. patent application Ser. No. 07/515,558, "Three-Terminal Operational Amplifier and Applications Thereof", filed Apr. 27, 1990 by the present inventor.

BACKGROUND OF THE INVENTION

1. Field of the Invention

This invention relates to instrumentation amplifiers.

2. Description of the Related Art

Instrumentation amplifiers are designed to amplify the difference between two voltage inputs with a defined gain, and to produce a single-ended output referenced to a known reference point, usually ground. Implementing an instrumentation amplifier in a general purpose fashion is somewhat complex using conventional operational amplifiers (op amps). A classic three op amp implementation is shown in FIG. 1. A pair of input op amps A1 and A2 receive input signals $V_{INP}$ $V_{INM}$ at their respective non-inverting inputs, while their inverting inputs are tied together through a gain resistor Rg. Each op amp A1, A2 has a respective feedback resistor Rfb connected between its output and its inverting input. The outputs of A1 and A2 are connected through respective resistors R1 and R2 to the noninverting and inverting inputs of a third op amp A3, respectively, with another resistor R3 tapped off the noninverting input of A3 to a voltage reference $V_{ref}$ (normally ground potential). The circuit output is taken from the output of A3, which includes a feedback resistor R4 to its inverting input. Voltage supplies V+ and V− provide the required supply voltages to each of the op amps.

Assuming R1, R2, R3 and R4 are equal, the overall transfer function for the circuit of FIG. 1 is:

$$V_o - V_{ref} = (V_{INP} - V_{INM})(2R_{fb}/R_g + 1)$$

This transfer function is somewhat awkward from a resistor value viewpoint, and additionally can never have a gain of less than unity. Two other significant drawbacks of the circuit are that the common mode input range reduces in the presence of a differential signal, and R1-R4 all have to match extremely well for good common mode rejection; any trimming performed on these resistors interacts with the gain equation.

Another restriction associated with the conventional instrumentation amplifier circuit is in the area of supply voltages. The amplifier's output should be able to swing at least down to ground. However, because of the amplifier's output resistance, its output voltage cannot be brought down to ground unless the negative supply voltage is less than ground. This requirement is not a problem if there are two supply voltages available (V+ and V−). In some instances, such as with most disk drives, there is only a single voltage supply available (V+), and V− must be set at ground. The standard instrumentation amplifier is not applicable to these situations.

SUMMARY OF THE INVENTION

The present invention seeks to provide an improved instrumentation amplifier that has a balanced input, a simplified gain equation that can have a value less than unity if desired, is capable of operating with only a single supply voltage, does not require the extremely close resistor tolerances of prior circuits, and has a common mode input range that does not significantly reduce in the presence of a differential signal.

These goals are realized with a circuit formed from three op amps. A differential voltage input is applied across the non-inverting inputs of the first and second op amps, with the circuit output taken from the output of the second op amp. All three op amps have feedback loops to their inverting inputs, with a unity gain loop for the first op amp. The output of the first op amp is connected to the inverting input of the second op amp through a first resistor, while the output of the third op amp is connected to the second op amp's input through another resistor; the third op amp's non-inverting input is also tied to either the inverting or the non-inverting input of the second op amp, depending upon circuit balance and speed considerations. A reference voltage (ground) is applied to the third op amp's inverting input.

Each of the op amps is supplied with a common pair of supply voltages. One of the supply voltages can be set equal to the ground reference voltage, thus making the circuit operable with only a single non-ground supply.

Gain selectability is achieved by providing an array of first resistors with different resistance values, and selecting among them. A special switching network is used that prevents the switch resistance from significantly effecting the overall instrumentation amplifier gain.

These and other features and advantages of the invention will be apparent to those skilled in the art from the following detailed description, taken together with the accompanying drawings, in which:

DETAILED DESCRIPTION OF THE INVENTION

Figure 1:
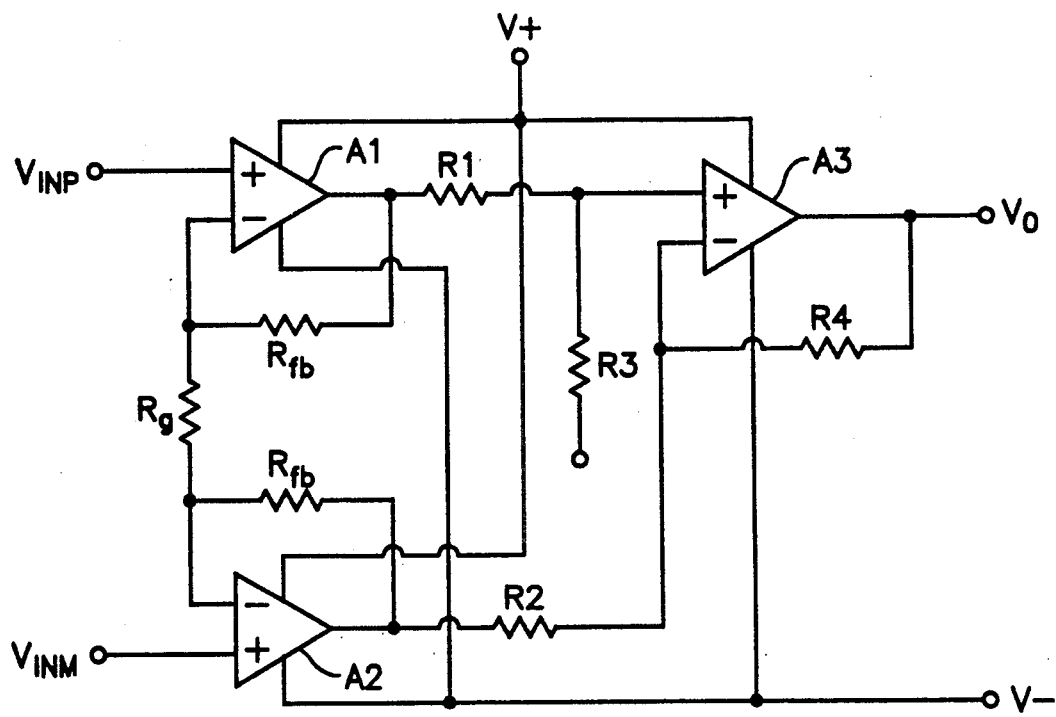
FIG. 1 is a circuit diagram of a conventional instrumentation amplifier.
Figure 2:
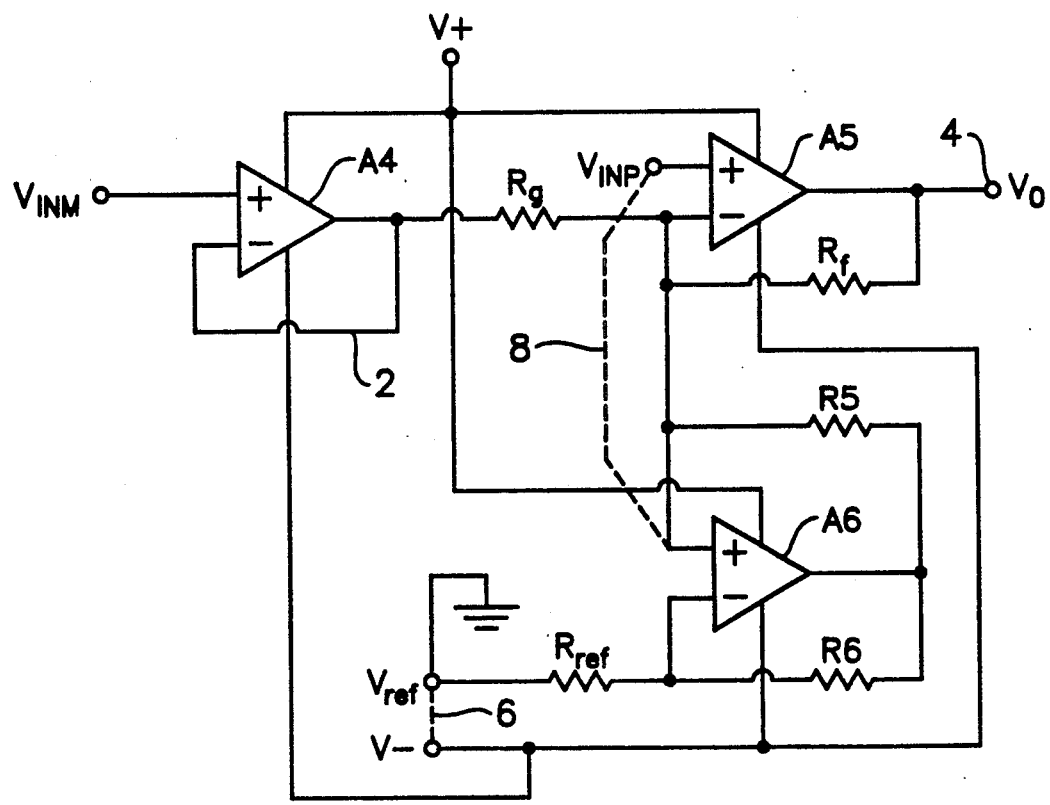
FIG. 2 is a circuit diagram showing a preferred embodiment for the improved instrumentation amplifier of the present invention.

An instrumentation amplifier that substantially removes all of the disadvantages discussed above in connection with the conventional circuit, and which also provides a balanced input, is shown in FIG. 2. The circuit includes three op amps A4, A5 and A6. Input voltage signals $V_{INM}$ and $V_{INP}$ are applied to the non-inverting inputs of A4 and A5, respectively, as an input differential voltage. The output of A4 is tied back to its inverting input by a short circuit connection 2, causing A4 to operate as a unity gain buffer.

The output of A4 is connected through a gain setting resistor Rg to both the inverting input of A5, and to the non-inverting input of A6. The output of A5 is connected to an output terminal 4 for the circuit, so that output voltage $V_o$ appears at terminal 4. The output of A5 is also connected in a feedback loop back to its inverting input through feedback resistor Rf, which together with Rg establishes the gain for the overall circuit.

The output of A6 is connected through a first resistor R5 to both its non-inverting input and to the inverting input of A5, and in a feedback loop through resistor R6 to its inverting input. A reference voltage $V_{ref}$, generally ground potential, is applied to the inverting input of A6 through a resistor Rref.

The positive and negative supply voltages for each op amp are provided by voltage supplies V+ and V−. With the described circuit, the output voltage $V_o$ can swing substantially all the way down to the negative supply level. This allows $V_{ref}$ and V− to be tied together at ground potential, as indicated by dashed line connection 6.

The transfer (gain) function of this circuit is:

$$V_o - V_{ref} = (V_{INP} V_{INM})(Rf/Rg)$$

This function is independent of Rref, which can be used to trim the common mode rejection ratio.

It should be noted that each of the inputs $V_{INM}$ and $V_{INP}$ are applied to the non-inverting inputs of single conventional op amps. The input to the circuit is thus balanced, allowing for a symmetrical operation.

The circuit described thus far can be less stable for AC applications, in which case its operation must be slowed down to avoid the instability. This limitation can be overcome, at the cost of unbalancing the circuit somewhat, by disconnecting the non-inverting input of A6 from the inverting input of A5, and connecting it instead to A5's non-inverting input. This alternate connection is indicated by dashed line 8 in FIG. 2.

Figure 3:
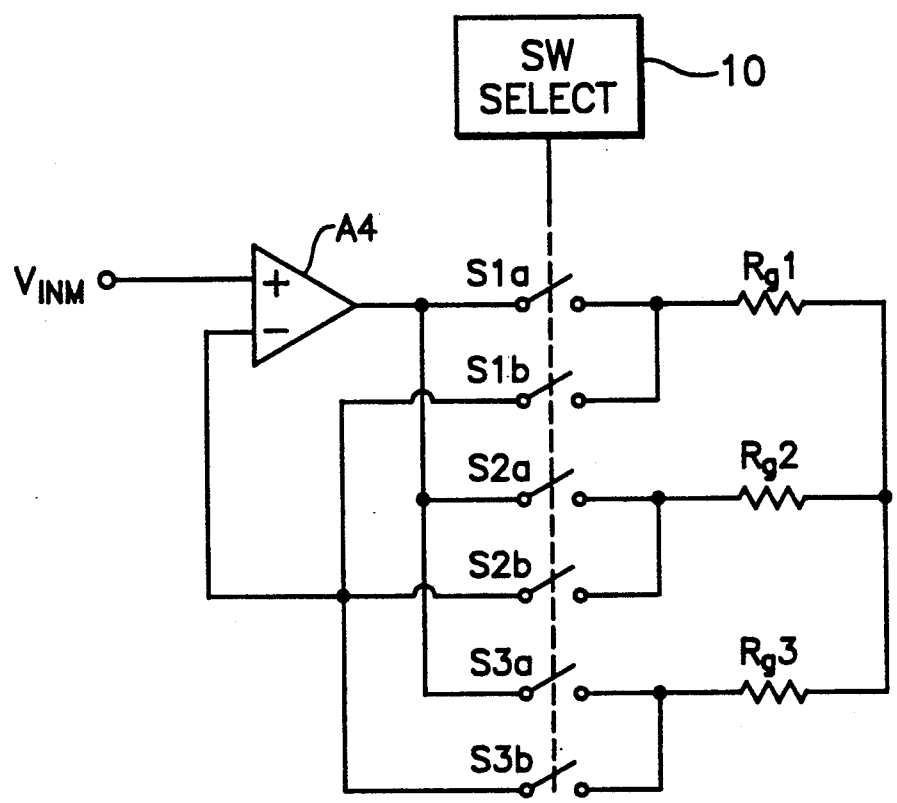
FIG. 3 is a circuit diagram of an embodiment that provides for gain selectability.

A modification of the above circuit that allows for gain programmability is shown in FIG. 3. Instead of a single gain setting resistor $R_g$, a plurality of resistors $R_g1$, $R_g2$, $R_g3$, etc. of different resistance values are provided. Each resistor is connected to the output of op amp A4 by a respective switch S1a, S2a, S3a, etc., and to the feedback loop for A4 by a second respective switch S1b, S2b, S3b, etc. One of the a/b switch pairs is closed in tandem while the other switches are left open by a switch select mechanism 10, which is preferably digitally operated. The overall instrumentation amplifier gain varies with the resistance value of the selected resistor, so that the overall gain can be selected from a range of possible values by selecting the appropriate resistor.

The switches are preferably implemented with junction field effect transistors (JFETs) or metal oxide semiconductor field effect transistors (MOSFETs) to enable integration with the remainder of the circuit, but other switch configurations could also be used. A special switching scheme is used to prevent the switch resistances from adding to the effective value of the gain setting resistor, and thus introducing an error into the instrumentation amplifier gain. The feedback loop switches S1b, S2b, S3b are connected to the junctions of the output switches S1a, S2a, S3a and their respective gain setting resistors $R_g1$, $R_g2$, $R_g3$. The output switches S1a, S2a, S3a are thus included in the feedback loops for A4; although they carry all of A4's output current and may produce an appreciable voltage drop, their placement within the feedback loop prevents their voltage drops from effecting the voltage applied to the gain setting resistor. The voltage drops across the feedback switches S1b, S2b, S3b are important in setting the instrumentation amplifier gain, but since these switches carry only the relatively small input current of A4, their voltage drops are negligibly small.

While alternate embodiments of the invention have been shown and described, numerous variations and additional embodiments will occur to those skilled in the art. Accordingly, it is intended that the invention be limited only in terms of the appended claims.

I claim:

1. An input instrumentation amplifier, comprising:

first, second and third operational amplifiers having respective inverting inputs, non-inverting inputs and outputs, the non-inverting inputs of the first and second operational amplifiers connected to receive a differential voltage input, the first operational amplifier output connected in a feedback circuit with its inverting input, and through a first gain setting impedance to the inverting input of the second operational amplifier and the non-inverting input of the third operational amplifier, the second operational amplifier's output connected to an output terminal and in a feedback circuit through a second gain setting impedance to its inverting input, and the third operational amplifier's output connected in respective feedback circuits to its inverting input and the inverting input of the second operation amplifier, its inverting input connected to receive a reference voltage, and its non-inverting input connected to one of the inputs of said second operational amplifier, said instrumentation amplifier producing an output voltage at said output terminal relative to said reference voltage that varies with the value of the differential voltage input and the ratio of said second to said first gain setting impedances.

2. The instrumentation amplifier of claim 1, each of said operational amplifiers being supplied with a common pair of supply voltages, wherein one of said supply voltages is said reference voltage.

3. The instrumentation amplifier of claim 2, wherein said reference voltage is ground potential.

4. The instrumentation amplifier of claim 1, wherein a plurality of first gain setting impedances of differing impedance values are provided, and further comprising means for selecting a desired first gain setting impedance for connection between the output of said first operational amplifier and the inverting input of said second operational amplifier, thereby allowing a selection of the gain for said instrumentation amplifier.

5. The instrumentation amplifier of claim 4, wherein the output of said first operational amplifier is connected to each of said first gain setting impedances through respective first switches that when closed carry the output current from the first operational amplifier, and the first operational amplifier's feedback circuit is connected through respective second switches to the junctions between each of said first switches and their respective first gain setting impedances, said second switches being paired with respective first switches and when closed carrying the first operational amplifier's feedback current, and said means for selecting a desired first gain setting impedance comprises means for operating said paired first and second switches in tandem so that a first switch when closed is included in the feedback circuit for said first operational amplifier, thereby preventing its resistance from altering the instrumentation amplifier's gain.

6. An instrumentation amplifier, comprising:
first, second and third operational amplifiers having respective inverting inputs, non-inverting inputs and outputs, the output of each operational amplifier connected in a respective feedback circuit with its inverting input,
the non-inverting inputs of the first and second operational amplifiers connected to receive respective signals of a differential voltage input,
the second operational amplifier's output connected to an output terminal,
the output of the first operational amplifier connected through a resistor to the inverting input of the second operational amplifier,
the output of the third operational amplifier connected through another resistor to the non-inverting input of the second operational amplifier,
the third operational amplifier's non-inverting input connected to one of the inputs of the second operational amplifier, and
the third operational amplifier's inverting input connected to receive a reference voltage.

7. The instrumentation amplifier of claim 6, the feedback circuit for the first operational amplifier providing substantially unity gain, so that said operational amplifier serves a buffer function.

8. The instrumentation amplifier of claim 6, each of said operational amplifiers being supplied with a common pair of supply voltages, wherein one of said supply voltages is said reference voltage.

9. The instrumentation amplifier of claim 8, wherein said reference voltage is ground potential.

10. The instrumentation amplifier of claim 6, wherein the non-inverting input of the third operational amplifier is connected to the inverting input of the second operational amplifier, thereby providing a balanced input for the instrumentation amplifier.

11. The instrumentation amplifier of claim 6, wherein the non-inverting input of the third operational amplifier is connected to the non-inverting input of the second operational amplifier, thereby enhancing the instrumentation amplifier's AC stability.

12. The instrumentation amplifier of claim 6, wherein a plurality of first resistors of differing resistance values are provided, and further comprising means for selecting a desired first resistor for connection between the output of said first operational amplifier and the inverting input of said second operational amplifier, thereby allowing a selection of the gain for said instrumentation amplifier.

13. The instrumentation amplifier of claim 12, wherein the output of said first operational amplifier is connected to each of said first resistors through respective first switches that when closed carry the output current from the first operational amplifier, and the first operational amplifier's feedback circuit is connected through respective second switches to the junctions between each of said first switches and their respective first resistors, said second switches being paired with respective first switches and when closed carrying the first operational amplifier's feedback current, and said means for selecting a desired first resistor comprises means for operating said paired first and second switches in tandem so that a first switch when closed is included in the feedback circuit for said first operational amplifier, thereby preventing its resistance from altering the instrumentation amplifier's gain.

* * * * *

UNITED STATES PATENT AND TRADEMARK OFFICE
CERTIFICATE OF CORRECTION

PATENT NO. : 5,075,633
DATED : December 24, 1991
INVENTOR(S) : Derek F. Bowers

It is certified that error appears in the above—identified patent and that said Letters Patent is hereby corrected as shown below:

Column 5, line 19: delete "non-".

Signed and Sealed this

Thirtieth Day of March, 1993

Attest:

STEPHEN G. KUNIN

Attesting Officer

Acting Commissioner of Patents and Trademarks